United States Patent
Nagai et al.

(10) Patent No.: US 6,767,643 B2
(45) Date of Patent: Jul. 27, 2004

(54) COPPER-ALLOY FOIL TO BE USED FOR LAMINATE SHEET

(75) Inventors: Hifumi Nagai, Ibaraki (JP); Junji Miyake, Ibaraki (JP); Yasuo Tomioka, Ibaraki (JP)

(73) Assignee: Nippon Mining and Metals Co., Ltd., Tokyo (JP)

( * ) Notice: Subject to any disclaimer, the term of this patent is extended or adjusted under 35 U.S.C. 154(b) by 130 days.

(21) Appl. No.: 09/931,406

(22) Filed: Aug. 17, 2001

(65) Prior Publication Data

US 2003/0044597 A1 Mar. 6, 2003

(30) Foreign Application Priority Data

Aug. 17, 2000 (JP) ........................................ 2000-247246

(51) Int. Cl.$^7$ ............................ B32B 15/08; B32B 9/00
(52) U.S. Cl. ........................ 428/457; 428/469; 428/471; 428/472
(58) Field of Search ............................... 428/336, 418, 428/457, 469, 471, 472

(56) References Cited

U.S. PATENT DOCUMENTS 6,426,548 B1 * 7/2002 Mita et al. ................ 257/673

FOREIGN PATENT DOCUMENTS

| JP | 9-157775 | 6/1997 |
| JP | 10-93006 | 4/1998 |
| JP | 11-243171 | 9/1999 |

* cited by examiner

Primary Examiner—Monique R. Jackson
(74) Attorney, Agent, or Firm—Birch, Stewart, Kolasch & Birch, LLP

(57) ABSTRACT

A copper-alloy foil used for a laminate sheet achieves 5.0N/cm or more of 180° peeling strength when thermally fusion-bonded with liquid crystal polymer. The copper-alloy foil contains one or more of from 0.01 to 2.0% of Cr and from 0.01 to 1.0% of Zr. An oxide layer and occasionally a rust-proof film present on the outermost surface is 10 nm or less. The electrical conductivity is 50% IACS.

8 Claims, 1 Drawing Sheet

COPPER-ALLOY FOIL TO BE USED FOR LAMINATE SHEET

BACKGROUND OF INVENTION

1. Field of Invention

The present invention relates to a copper-alloy foil to be used for a laminate sheet of a printed circuit board.

2. Description of Related Art

The printed circuit board, which is frequently used for the electronic circuit of electronic machines, is roughly classified, depending upon the kind of base resin, as a rigid board comprising glass-epoxy material or paper-phenol, and a flexible board comprising polyimide or polyester. Copper foil is mainly used as the conducting material of the printed circuit board. The copper foil is classified, depending upon the production process, as electro-deposited copper foil and wrought copper foil. The electro-deposited copper foil is produced by means of electrolytically precipitating copper from a copper sulfate bath on a titanium or stainless-steel drum. The wrought copper foil is produced by means of plastically forming copper by rolling rolls. A characteristic of the wrought copper foil resides in that the surface profile of the rolling rolls is printed on the surface of a foil, so that the foil has a smooth surface. Incidentally, a sheet having 100 $\mu$m or less of thickness is generally referred to as the foil.

Resin substrates and copper foils are laminated by using a binder, followed by heating and exerting pressure to the binder to cure it. A printed circuit board is thus manufactured. Polyimide resin film and polyester resin film have heretofore been mainly used as the resin substrate of a flexible board. Wrought copper foil is mainly used as the foil of a flexible board, because it has good flexibility.

A binder consisting of a thermosetting resin such as epoxy resin and the like is used for laminating a copper foil and the resin. The laminated copper foil and resin is heated and subjected to pressure at 130 to 170° C. for 1 to 2 hours. The binder is thus cured. The copper foil is then etched to form it into various circuit patterns. The electronic parts are connected and mounted on the conductor patterns by solder. Since the materials of the printed circuit board are repeatedly exposed to such high temperature, they are required to be heat-resistant. Lead-free solder is used in recent years in the light of anti-environmental pollution concerns. The melting point of the lead-free solder becomes accordingly high with the result that higher heat-resistance is required for the printed circuit board. Polyimide, which exhibits higher heat resistance than polyester, is therefore broadly used.

The flexible substrate is characterized by its flexibility. The flexible substrate is, therefore, used for the conductors of movable parts and can, thus, be mounted in the electronic machines in a bent state. The flexible board is, therefore space-saving material. In addition, since the flexible substrate is thin, it is used for the interposer of a semiconductor package or an IC tape carrier of a liquid-crystal display. The width of the conductors and the inter-conductor spacing of an electronic circuit are narrowed, since high-density mounting is required in these applications. However, since the polyimide resin used broadly in the flexible substrate is hygroscopic, it may detrimentally absorb moisture of the atmosphere and deform, unless it is handled under a dry state subsequent to laminating the copper foil to the polyimide by heating and pressure application. When the printed circuit board, for which the polyimide is used, is delineated to such fine pitch as required in recent years, a problem in dimensional stability arises. The frequency of electric signals is increased in personal computers and communication from a traveling body. The resin substrate having a small relative dielectric constant is required to cope with the frequency increase mentioned above.

Employment of liquid crystal polymer is considered to meet the requirements of a resin substrate used in the printed circuit board described above. The liquid crystal polymer is a super-engineering plastic and is classified as thermotropic type and lyotropic type. The thermotropic liquid crystal is used for the printed circuit board. The thermotropic liquid crystal is characterized by high strength, chemical resistance, lower hygroscopicity and superior dimension as stability compared to the polyimide. The relative dielectric constant of the liquid crystal is approximately 3.0 and is thus lower than the approximately 3.5 of polyimide. The liquid crystal is, therefore, suitable for the resin substrate used under high frequency. Although the liquid crystal belongs to the aromatic polyester-based thermoplastic resin, the liquid crystal exhibits excellent heat resistance and can be used for such an application to be solder-bonded. Meanwhile, since the liquid crystal softens upon heating to the melting point or higher, when the copper foil as the conductor material and the liquid-crystal polymer are heated and subjected to pressure, they can be laminated under thermal fusion-bonding without a binder.

Regarding the polyimide resin broadly used at present for the printed circuit board, its coefficient of thermal expansion is $2.7 \times 10^{-5}/°$ C. and is different from that of copper, i.e., $1.6 \times 10^{-5}/°$ C. The printed circuit board is, therefore, liable to deflect during heating. On the other hand, the molecules of the liquid crystal are in the form of thin rods, and hence the coefficient of thermal expansion is different in the directions of longitudinal axis and the short axis of molecules. It is, therefore, possible to control the orientation of the molecular arrangement of the liquid crystal and to utilize these properties thus to adjust the coefficient of thermal expansion. The thermal coefficient of the liquid crystal can be made to agree with that of the copper, i.e., the conductor material. As a result, the printed circuit board becomes difficult to deflect. Although the liquid crystal and the copper foil can be laminated with a binder, when the binder having a different coefficient of thermal expansion from that of the liquid crystal and copper is sandwiched between them, the dimensional stability is impaired. Desirably, the liquid crystal and the copper foil are directly laminated to retain high dimensional stability of the printed circuit board.

Pure copper or a copper alloy with small additive elements is used as the copper foil-conductors. Since the fine pitch of copper conductors, narrowing and thinning of electronic circuits are concurrently realized, the copper foil is required to have small loss of direct-current resistance and high electrical conductivity. Copper is a material having excellent electrical conductivity. In the application, where importance is attached to the electrical conductivity, pure copper having 99.9% or more of purity is generally used. However, the heat resistance of copper is drastically lowered with the increase in purity. When copper having higher purity is laminated on a resin substrate such as polyimide substrate or is heated during the solder bonding, the copper foil more detrimentally deforms or fractures, thereby lowering its reliability Therefore, both electrical conductivity and heat resistance are required.

It has been attempted to thermally fusion-bond the liquid crystal resin-substrate and copper foil without a binder as follows. A film of the liquid crystal polymer and a wrought copper foil are heated to the melting point of the liquid crystal polymer or higher and are subjected to pressure by means of a heating press machine or heating rollers. The adherence of the liquid crystal and the wrought copper foil turned out, however, to be poor, and they were likely to peel. Specifically, when the liquid crystal having the structural formula given below and copper foil are thermally fusion-bonded at 345° C., the 180° peeling strength (according to the stipulation of JIS C 5016) of the resultant laminate is only approximately 4N/cm.

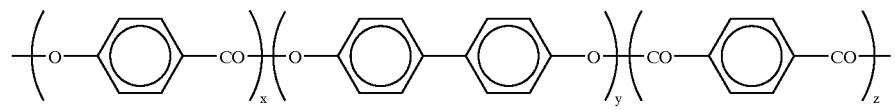

(1)

The copper foil conductor is likely to peel from the liquid crystal of the printed circuit board. Such problems as fracture of the conductor are likely to arise. The printed circuit board, in which the liquid crystal polymer is used, has, therefore, not be practically used.

SUMMARY OF INVENTION

The peeling strength required for a printed circuit board is dependent upon the conditions of process and the environment in which the electronic machines are used. However, generally speaking, 5.0N/cm or more of 180° peeling strength is considered to enable practical application of the printed circuit board. Therefore, the target value of 180° peeling strength according to the present invention is 5.0N/cm or more. In addition, the target value of electrical conductivity is 50% IACS (International Annealed Copper Standard) or more. The target value of heat resistance is determined by consideration for taking soldering with electronic parts or thermal fusion-bonding with the liquid crystal polymer. The thermal resistance is defined by the value of the heating temperature, at which the tensile strength after heating for 1 hour is reduced to an intermediate level between that of prior to heating and that after fully annealed. The target value of heating temperature is 350° C. or more.

It is an object of the present invention to improve the adherence to such a level that the liquid crystal polymer—copper foil laminate can be practically used as the printed circuit board.

It is a specific object of the present invention to provide a copper-alloy foil exhibiting improved adherence with respect to the liquid crystal polymer.

The present inventors added a small amount of additive element(s) to pure copper, exhibiting excellent electrical conductivity and discovered that adherence with respect to the liquid crystal polymer is improved by the additive element(s). More specifically, there is provided the following copper foils exhibiting both high electrical conductivity and improved adherence with respect to the liquid crystal polymer.

(1) Copper-alloy foil used for a laminate sheet contains, by weight percentage, one or more of from 0.01 to 2.0% of Cr and from 0.01 to 1.0% of Zr, the balance being copper and unavoidable impurities, and comprises on the outermost surface a 10 nm or less (excluding 0 nm) thick oxide layer and occasionally a rust-proof film, and 50% IACS or more of electrical conductivity, and 5.0N/cm or more of 180° peeling strength when thermally fusion-bonded with the liquid crystal polymer.

(2) Copper-alloy foil used for a laminate sheet contains, by weight percentage, one or more of from 0.01 to 2.0% of Cr and from 0.01 to 1.0% of Zr, and further contains from 0.005 to 2.5% in total of at least one element selected from the group consisting of Ag, Al, Be, Co, Fe, Mg, Ni, P, Pb, Si, Sn, Ti and Zn, the balance being copper and unavoidable impurities, and comprises on the outermost surface a 10 nm or less (excluding 0 nm) thick oxide layer and occasionally a rust-proof film, and 50% IACS or more of electrical conductivity, and 5.0N/cm or more of 180° peeling strength when thermally fusion-bonded with the liquid crystal polymer.

(3) Copper-alloy foil according to (1) or (2) has 350° C. or more of heating temperature, at which the tensile strength after heating for 1 hour is intermediate between that prior to heating and that after fully annealed.

DESCRIPTION OF PREFERRED EMBODIMENTS

The reasons for limiting the alloy composition as mentioned above are hereinafter described.

(1) Cr, Zr: Cr and Zr are known to have a catalytic effect to promote polymerization of resin. This effect of Cr and Zn added to the copper may enhance the adherence of the copper alloy with respect to the liquid crystal. Since Cr and Zr are active elements, they seem to promote bonding between the metal and resin. When the addition amounts Cr and Zr are too small, the catalyzing effect and hence the bonding between the metal and resin is unsatisfactory. Improvement in the adherence is, therefore, slight. In order to attain 5.0N/cm or more of 180° peeling strength, which is necessary for the practical printed circuit board, 0.01% by weight or more of at least one of Cr and Zr must be added. The greater the addition amount of Cr and/or Zr, the better is the adherence.

On the other hand, Cr and Zr may segregate during casting along with the increase in their addition amounts, with the result that coarse crystals may be formed. The metallic material, including the coarse crystals, has poor hot-workability and may be fractured during the hot-rolling. The upper limits of Cr and Zr are, therefore, 2.0% by weight and 1.0% by weight, respectively. A copper-alloy foil laminated with liquid crystal polymer to form a printed circuit board should contain the alloying elements, within the following ranges i.e., from 0.01 to 2.0% by weight of Cr and from 0.01 to 1.0% by weight of Zr.

(2) Ag, Al, Be, Co, Fe, Mg, Ni, P, Pb, Si, Sn, Ti and Zn: Any one of Ag, Al, Be, Co, Fe, Mg, Ni, P, Pb, Si, Sn, Ti and Zn is effective for enhancing heat resistance of the copper alloy. One or more of these elements are added if necessary. When the total amount of these elements is less than 0.005% by weight, the achievements due to the above effects fall short of the desired levels. On the other hand, when the total amount of these elements exceeds 2.5% by weight, the electrical conductivity, soldering property and workability are seriously impaired. The total content of Ag, Al, Be, Co, Fe, Mg, Ni, P, Pb, Si, Sn, Ti and Zn is, therefore, from 0.005 to 2.5% by weight.

Incidentally, the epoxy resin, which is generally used in the plastic semiconductor package, attains high adherence even if an oxide film (layer) is present on the surface of the copper alloy. The epoxy resin has the following structural formula.

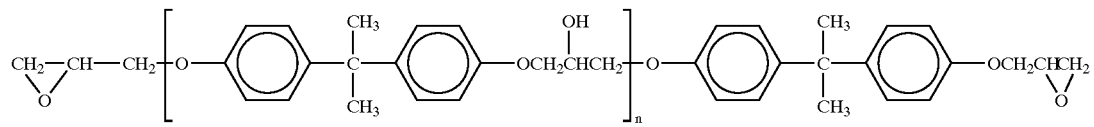

(2)

For example, Japanese Patent Publication Kokai No. 10-93006 describes that the material of the lead frame is a copper alloy, which contains from 0.05 to 0.4% of Cr, from 0.03 to 0.25% of Zr, and from 0.06 to 2.0% of Zn, the balance being copper and unavoidable impurities, and which has an oxide film on the surface thereof. The adherence of the plastic semiconductor package is high due to the copper alloy mentioned above. This is attributable to the fact that the adherence of the epoxy resin and copper alloy is enhanced due to the hydrogen bond between the hydroxyl group contained mainly in the epoxy resin and the oxygen atoms of the oxide formed on the copper alloy. The additive elements improve the adherence between the copper material and the oxide film.

However, it was discovered that a thick oxide-layer of the copper alloy impedes the catalytic effect mentioned above to polymerize liquid crystal having the structural formula (1) mentioned above. Improvement of adherence with the resin is, therefore, not realized. In addition, benzotriazole or the like is usually applied to the foil to prevent further oxidation of the foil surface from advancing. A rust-proof film is thus formed on the foil surface. When the rust-proof film is too thick, it decomposes during the heating of the resin and laminating with the foil. The rust-proof film is, therefore, liable to peel from the foil. As a result, the adherence with the resin is, therefore, lowered. Based on the researches by the present inventors, the thickness of the oxide layer should be limited to 10 nm or less measured from the surface of the foil material, so as to prevent the decrease of adherence. In a case that a rust-proof layer is present, its thickness should also be limited to 10 nm or less measured from the surface of the foil, as well.

The thickness of the oxide layer and the rust-proof film from the surface of the foil can be quantitatively measured by means of Auger electron spectroscopy. That is, the Auger electron spectroscopy is carried out in the depth direction. The "thickness of the oxide layer" is the thickness of the layer from the surface, where the detection intensity of oxygen becomes to an identical level as that of the background. The measurement is converted to $SiO_2$. The "thickness of the rust-proof film" is the thickness of the layer from the surface, where the detection intensity of nitrogen, i.e., a constituent atom of the rust-proof film, becomes to an identical level as that of the background. The measurement is converted to $SiO_2$.

BRIEF DESCRIPTION OF DRAWING

Referring to FIG. 1, the detecting intensity of oxygen and nitrogen decreases in the direction from the surface to the interior. The detecting intensity of oxygen and nitrogen becomes the same as that of the background at positions (a) and (b), respectively. The thickness of the oxide layer and the rust-proof film is determined at the positions (a) and (b), respectively.

Figure 1:
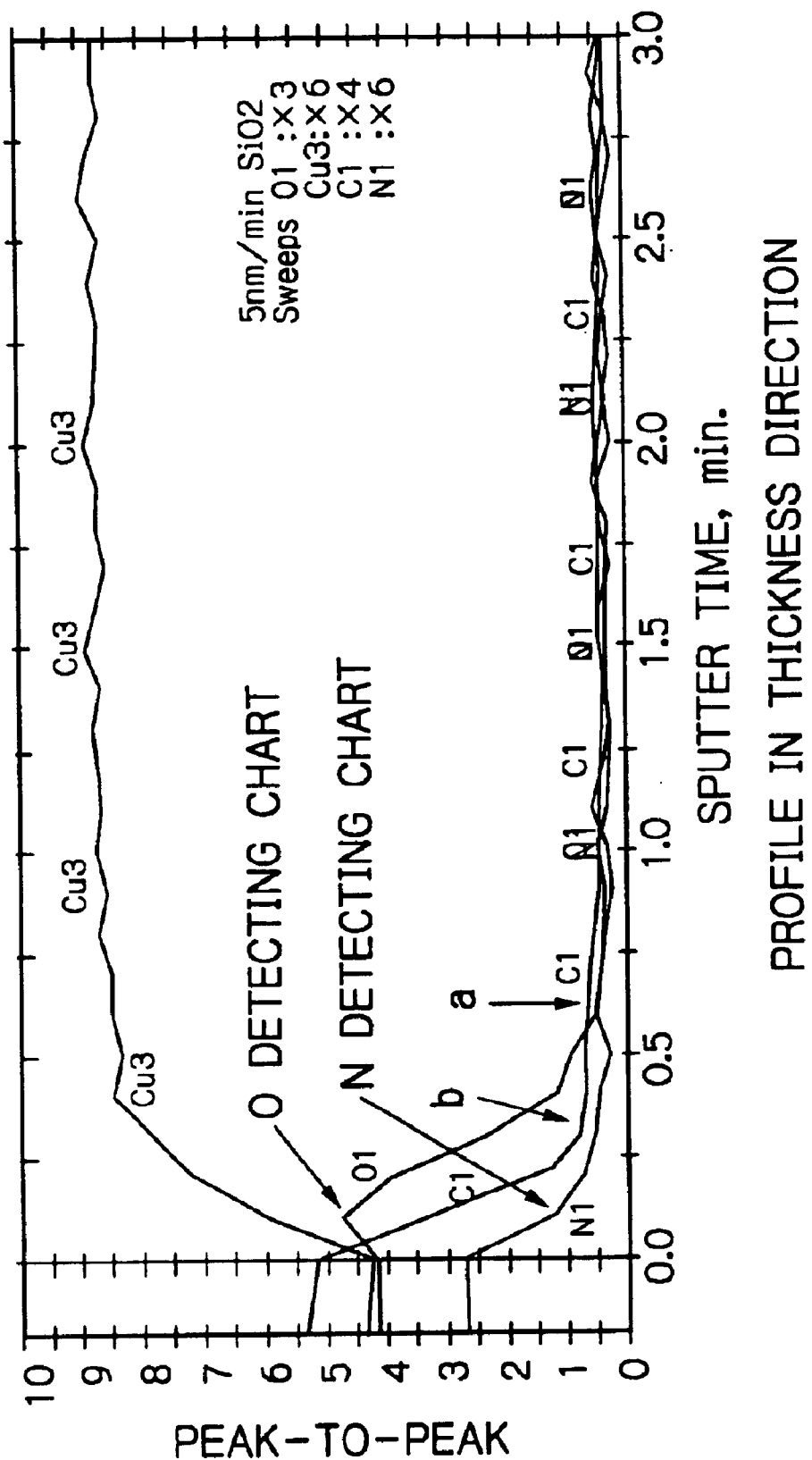
FIG. 1 is an Auger electron spectroscopy chart.

The method for producing the copper-alloy foil according to the present invention is not limited specifically. The method may be, for example, an alloy-plating method for producing an electro-deposited copper-alloy foil, or a wrought method, in which a copper alloy is melted, cast and wrought. The description hereinbelow is related to the rolling method.

Copper is melted. A predetermined amount of alloying elements is added to the pure copper-melt. The alloy melt is then cast into a mold to form an ingot. Since such active elements as Cr and Zr are added in the melting and casting process, this process is desirably carried out in vacuo or in an inert-gas protective atmosphere to prevent formation of oxide of active element and the like. The ingot is hot-rolled to a certain thickness and is then subjected to scalping. Cold-rolling and annealing are then repeatedly carried out. Finally, the cold-rolling is carried out to finish the foil. Since the rolling oil is adhered on the material as wrought, it is subjected to degreasing treatment with acetone, a petroleum-based solvent or the like.

Annealing forms the oxide layer. It is necessary to reduce the thickness of a the oxide layer, for example by pickling preferably using sulfuric acid containing hydrogen peroxide, nitric acid containing hydrogen peroxide or sulfuric acid containing hydrogen peroxide and fluoride.

In order to reduce the thickness of the rust-proof layer, the concentration of a rust-proof agent can be lowered. In a case of using benzotriazole as the rust-proof agent, its concentration is preferably adjusted to 1000 ppm or less.

EXAMPLES

The present invention is hereinafter described by way of examples.

Oxygen-free copper is melted in a high-purity graphite crucible under Ar protective atmosphere using a high-frequency vacuum induction melting furnace. Cr, Zr and the other selected elements are then added to the copper melt and cast into a mold made of cast iron to obtain a copper-alloy ingot 30 mm in thickness, 50 mm in width and 150 mm in length and approximately 2 kg in weight. This ingot is heated to 900° C. and then hot-rolled to reduce its thickness to 8 mm. The oxide scales are removed. Then, the cold-rolling and heat treatment are repeated to obtain a 35 $\mu$m thick as-wrought foil. Since a copper alloy containing Cr or Zr is a precipitation-hardening type, solution treatment and aging are carried out to precipitate Cr and the like and to enhance the strength and electrical conductivity. The solution treatment is carried out by heating at 600 to 900° C. followed by quenching into water. The aging is carried out at 350 to 500° C. for 1 to 5 hours.

Since the rolling oil is adhered on the 35 $\mu$m thick copper-alloy foil obtained by the above-described process, it is dipped in acetone and to remove the oily matter. The so-treated foil is dipped in an aqueous solution, which contains 10% by weight of sulfuric acid and 1% by weight of hydrogen peroxide. The oxide layer and rust-proof film are thus removed from the surface. The so-treated copper-alloy foil and liquid crystal expressed by the structural formula (1) mentioned above are laminated and fusion-bonded by means of a surface-heating press machine held at 345° C.

With regard to the copper-alloy foil obtained as described above, "the hot-rolling workability", "the thickness of the oxide layer and rust-proof film", "the electrical conductivity", "heat resistance" and "peeling strength" were evaluated by the following methods.

(1) Hot-rolling Workability. The hot-rolled material is examined by liquid penetrant testing. Appearance of the material is observed by the naked eye to detect the presence or absence of cracks. The absence of cracks is indicated by ◯ in Table 2, while the presence of cracks is indicated by X in Table 2.

(2) Thickness of the oxide layer and rust-proof film. The Auger electron spectroscopy analysis is carried out in the thickness direction. The "thickness of the oxide layer" is the thickness of the layer from the surface, where the detection intensity of oxygen becomes to an identical level as that of the background. The measurement is converted to $SiO_2$. The "thickness of the rust-proof film" is the thickness of the layer from the surface, where the detection intensity of nitrogen, i.e., a constituent atom of the rust-proof film, becomes to an identical level as that of the background. The measurement is converted to $SiO_2$.

(3) Electrical conductivity. The electric resistance at 20° C. is measured by the direct current four-terminal method, in which double bridges are used. The measured specimens were cut into 12.7 mm width. The distance for measuring the electric resistance is 50 mm.

(4) Heat Resistance. Heating is carried out at a predetermined temperature for 1 hour. Tensile strength is then measured at room temperature. The heating temperature, at which the measured tensile strength is intermediate between that prior to heating and the heated and fully softened tensile strength is identified as the softening temperature.

(5) Peeling strength. 180° peeling strength is measured in accordance with the method stipulated in JIS C 5016. A 5.0 mm wide specimen, i.e., a copper-alloy foil, is peeled from the liquid crystal polymer which is fixed to a tensile testing machine. The specimen is bent into the 180° direction and peeled from the liquid crystal polymer.

The composition of copper alloys is shown in Table 1. The evaluation results of the properties of copper-alloy foils are shown in Table 2. The symbol—in the tables indicates no-measurement. The oxygen content of the copper-alloy foils containing volatile element such as Zn or Pb cannot be measured. The cracked materials are not subjected to further tests.

The materials Nos. 1 through 15 are examples of the copper-alloy foil according to the present invention. As is shown in Table 2, the electrical conductivity of the copper-alloy foil according to the present invention is 50% IACS or more. The 180° peeling strength of the thermally fusion-bonded liquid crystal and foil is 5.0N/cm or more. The electrical conductivity and peeling strength are therefore improved. No cracks are formed on the copper-alloy foils according to the present invention during the hot-rolling. Fe, Ni, Co or Sn is added in Nos. 13 and 15 for enhancing the heat resistance in an amount close to the upper limit, i.e., 2.5%. The electrical conductivity is lowest in these samples of the present invention.

TABLE 1

Alloy Compositions of Inventive Examples and Comparative Examples

| | No | Cr | Zr | Ag | Al | Be | Co | Fe | Mg | Ni | P | Pb | Si | Sn | Ti | Zn | O (ppm) | Cu and Unavoidable Impurities |
|---|---|---|---|---|---|---|---|---|---|---|---|---|---|---|---|---|---|---|
| Examples | 1 | 0.17 | — | — | — | — | — | — | — | — | — | — | — | — | — | — | 5 | bal |
| | 2 | 1.5 | — | — | — | — | — | — | — | — | — | — | — | — | — | — | 8 | bal |
| | 3 | — | 0.18 | — | — | — | — | — | — | — | — | — | — | — | — | — | 4 | bal |
| | 4 | — | 0.47 | — | — | — | — | — | — | — | — | — | — | — | — | — | 10 | bal |
| | 5 | 0.47 | 0.46 | — | — | — | — | — | — | — | — | — | — | — | — | — | 4 | bal |
| | 6 | — | 0.44 | — | — | — | — | — | — | — | — | — | — | — | — | 0.25 | — | bal |
| | 7 | 0.45 | — | — | — | — | — | — | — | — | — | — | — | — | — | 0.13 | — | bal |
| | 8 | 0.38 | 0.17 | — | — | — | — | — | — | — | — | — | — | — | — | 0.11 | — | bal |
| | 9 | 0.32 | — | — | — | — | — | — | — | 0.72 | — | — | — | 0.71 | 0.50 | — | 3 | bal |
| | 10 | 0.76 | 0.15 | — | — | — | — | — | 0.05 | — | — | — | — | — | — | — | 8 | bal |
| | 11 | 0.96 | — | — | — | — | — | 0.10 | — | — | — | 0.06 | 0.11 | — | — | — | — | bal |
| | 12 | 0.71 | — | 0.11 | — | — | — | — | — | — | 0.04 | 0.15 | — | — | — | — | — | bal |
| | 13 | 0.18 | — | — | 0.01 | — | 0.06 | 1.4 | — | — | — | 0.01 | — | 0.45 | — | — | — | bal |
| | 14 | 0.22 | — | — | — | — | — | — | — | — | — | — | — | 0.27 | — | 0.17 | — | bal |
| | 15 | — | 0.18 | — | — | 0.22 | 0.61 | — | — | 1.2 | — | — | — | — | — | — | 7 | bal |
| Comparative Examples | 16 | — | — | — | — | — | — | — | — | — | — | — | — | — | — | — | 4 | bal |
| | 17 | 0.007 | — | — | — | — | — | — | — | — | — | — | — | — | — | — | 4 | bal |
| | 18 | — | 0.004 | — | — | — | — | — | — | — | — | — | — | — | — | — | 4 | bal |
| | 19 | 2.4 | — | — | — | — | — | — | — | — | — | — | — | — | — | — | 6 | bal |
| | 20 | — | 1.4 | — | — | — | — | — | — | — | — | — | — | — | — | — | 10 | bal |
| | 21 | 0.28 | — | — | — | — | — | — | — | — | — | — | — | — | 2.7 | — | 5 | bal |
| | 22 | 0.38 | 0.17 | — | — | — | — | — | — | — | — | — | — | — | — | 0.11 | — | bal |
| | 23 | 0.38 | 0.17 | — | — | — | — | — | — | — | — | — | — | — | — | 0.11 | — | bal |

TABLE 2

Evaluation Results of Inventive Examples and Comparative Examples

| No | | Hot-Rolling Workability | Pickling | Thickness of Oxide Layer (nm) | Thickness of Rust-Proof Film (nm) | Electric Conductivity (% IACS) | Softening Temperature (° C.) | 180 Peel Strength (N/cm) |
|---|---|---|---|---|---|---|---|---|
| Examples | 1 | ○ | yes | 1 | 1 | 85 | 300 | 5.9 |
| | 2 | ○ | yes | 3 | 1 | 69 | 340 | 6.7 |
| | 3 | ○ | yes | 1 | 1 | 90 | 300 | 6.0 |
| | 4 | ○ | yes | 2 | 1 | 75 | 340 | 6.6 |
| | 5 | ○ | yes | 2 | 1 | 83 | 340 | 6.7 |
| | 6 | ○ | yes | 1 | 1 | 70 | 360 | 6.7 |
| | 7 | ○ | yes | 1 | 1 | 84 | 360 | 6.7 |
| | 8 | ○ | yes | 1 | 1 | 75 | 380 | 6.6 |
| | 9 | ○ | yes | 8 | 1 | 55 | 420 | 6.0 |
| | 10 | ○ | yes | 2 | 2 | 82 | 410 | 6.0 |
| | 11 | ○ | yes | 2 | 2 | 80 | 400 | 6.1 |
| | 12 | ○ | yes | 2 | 1 | 66 | 380 | 5.8 |
| | 13 | ○ | yes | 2 | 1 | 52 | 360 | 5.4 |
| | 14 | ○ | yes | 2 | 2 | 75 | 380 | 6.4 |
| | 15 | ○ | yes | 1 | 2 | 55 | 400 | 6.0 |
| Comparative Examples | 16 | ○ | yes | 3 | 1 | 99 | 120 | 4.0 |
| | 17 | ○ | yes | 1 | 1 | 93 | 180 | 4.8 |
| | 18 | ○ | yes | 1 | 1 | 97 | 140 | 4.4 |
| | 19 | X | — | — | — | — | — | — |
| | 20 | X | — | — | — | — | — | — |
| | 21 | ○ | yes | 4 | 2 | 11 | 450 | 6.0 |
| | 22 | ○ | yes | 18 | 4 | 75 | 380 | 3.2 |
| | 23 | ○ | yes | 2 | 11 | 75 | 380 | 0.9 |

Comparative Example No. 16 shown in Table 1 is a wrought copper foil free of the alloying elements according to the present invention. The oxygen-free copper is melted and cast in Ar protective atmosphere into an ingot. This ingot is worked into a foil, which is then thermally fusion-bonded with the liquid crystal polymer. Since the material is pure copper, the electrical conductivity is high. However, the 180° peeling strength is as low as 4.0N/cm. This foil may peel when it is used as the printed circuit board. The foil is, therefore, not suitable for practical use.

In Comparative Examples Nos. 17 and 18, only one of Cr and Zr is added, respectively. The process for forming the foil is the same as in the inventive examples. Since the Cr or Zr content is less than 0.01%, they are not effective for improving the adherence. The 180° peeling strength is less than 5.0N/cm and low.

Cr is added in Comparative Example No. 19. Since its content is more than 2.0% by weight, coarse Cr crystals are formed during the casting. Cracks are formed during the hot rolling. The hot-rolling workability is therefore poor.

Only Zr is added in Comparative Example No. 20. Since its content is more than 1.0% by weight, cracks are formed during the hot-rolling. Further tests of Comparative Examples No. 19 and 20 could therefore not be carried out.

Ti is added in Comparative Example No. 21. Since its content is more than 2.5% by weight, the electrical conductivity is too low to use it as the conductive material of a printed circuit board.

In Comparative Example No. 22, the copper-alloy of Example No. 8 is used. However, the pickling step to remove the oxide layer and rust-proof film is deleted, omitted. The thickness of the oxide layer and rust-proof film of Comparative Example No. 22 is, therefore, different from that of Example No. 8. The 180° peeling strength is 3.2N/cm and low.

In Comparative Example 23, the copper-alloy foil of Example 8 is used and finally degreased by acetone containing 2.0% (20000 ppm) of benzotriazole. Since the rust proof film is thick, the 180° peeling strength is 0.9N/cm and low.

INDUSTRIAL APPLICABILITY

The copper-alloy film according to the present invention is used for a laminate sheet with liquid crystal polymer for manufacturing a printed circuit board. The adherence of the copper-alloy film with the base resin is improved. In addition, the electrical conductivity and heat resistance of the copper-alloy foil are high. The copper-alloy foil is appropriate for application as the conductive material of an electronic circuit in fine pattern.

What is claimed is:

1. A copper-alloy foil used for a laminate sheet, which contains, by weight percentage, one or more of from 0.01 to 2.0% of Cr and from 0.01 to 1.0% of Zr, the balance being copper and unavoidable impurities, and which comprises on the outermost surface, an oxide layer and a rust-proof film which taken together are greater than 0 nm up to and including 10 nm in thickness, and 50% IACS or more of electrical conductivity, and 5.0N/cm or more of 180° peeling strength when thermally fusion-bonded with a liquid crystal polymer.

2. A copper-alloy foil used for a laminate sheet, which contains, by weight percentage, one or more of from 0.01 to 2.0% of Cr and from 0.01 to 1.0% of Zr, and which further contains from 0.005 to 2.5% in total of at least one element selected from the group consisting of Ag, Al, Be, Co, Fe, Mg, Ni, P, Pb, Si, Sn, Ti and Zn, the balance being copper and unavoidable impurities, and comprises on the outermost surface, an oxide layer and a rust-proof film which taken together are greater than 0 nm up to and including 10 nm in thickness, and 50% IACS or more of electrical conductivity, and 5.0N/cm or more of 180° peeling strength when thermally fusion bonded with a liquid crystal polymer.

3. A copper-alloy foil according to claim 1 or 2, which has been heated to 350° C. or higher for 1 hour, so the tensile strength is intermediate between that prior to heating and that after fully annealed.

4. A laminate sheet of a copper-alloy foil and liquid crystal polymer thermally fusion-bonded without a binder, wherein said copper-alloy foil contains, by weight percentage, one or more of from 0.01 to 2.0% of Cr and from 0.01 to 1.0% of Zr, the balance being copper and unavoidable impurities, and comprises on the outermost surface, an oxide layer and a rust-proof film which taken together are greater than 0 nm up to and including 10 nm in thickness, and 50% IACS or more of electrical conductivity, and 5.0N/cm or more of 180° peeling strength when thermally fusion bonded with a liquid crystal polymer.

5. A laminate sheet of a copper-alloy foil and liquid crystal polymer thermally fusion-bonded without a binder, wherein said copper-alloy foil contains, by weight percentage, one or more of from 0.01 to 2.0% of Cr and from 0.01 to 1.0% of Zr, and further contains from 0.005 to 2.5% in total of at least one element selected from the group consisting of Ag, Al, Be, Co, Fe, Mg, Ni, P, Pb, Si, Sn, Ti and Zn, the balance being copper and unavoidable impurities, and comprises on the outermost surface, an oxide layer and a rust-proof film which taken together are greater than 0 nm up to and including 10 nm in thickness, and 50% IACS or more of electrical conductivity, and 5.0N/cm or more of 180° peeling strength when thermally fusion bonded with a liquid crystal polymer.

6. A laminate sheet of a copper-alloy foil and liquid crystal polymer according to claim 4 or 5, wherein said copper-alloy foil which has been heated to 350° C. or higher for 1 hour, so the tensile strength is intermediate between that prior to heating and that after fully annealed.

7. A laminate sheet of a cooper-alloy foil and liquid crystal polymer according to claim 4 or 5, wherein said liquid crystal polymer is a thermotropic type.

8. A laminate sheet of a cooper-alloy foil and liquid crystal polymer according to claim 7, wherein said liquid crystal polymer has the same coefficient of thermal expansion as that of the cooper-alloy foil.

* * * * *